United States Patent
Ahn et al.

(10) Patent No.: US 10,347,869 B2
(45) Date of Patent: Jul. 9, 2019

(54) ORGANIC LIGHT-EMITTING DISPLAY DEVICE AND METHOD OF MANUFACTURING THE SAME

(71) Applicant: SAMSUNG DISPLAY CO., LTD., Yongin-si, Gyeonggi-Do (KR)

(72) Inventors: Ki-Wan Ahn, Gyeonggi-Do (KR); Jae-Hyuck Jang, Gyeonggi-Do (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/264,473

(22) Filed: Sep. 13, 2016

(65) Prior Publication Data
US 2017/0005294 A1    Jan. 5, 2017

Related U.S. Application Data

(62) Division of application No. 14/049,893, filed on Oct. 9, 2013, now Pat. No. 9,450,211.

(30) Foreign Application Priority Data

Jun. 26, 2013  (KR) .................. 10-2013-0073972

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 51/52* | (2006.01) | |
| *H01L 27/32* | (2006.01) | |
| *H01L 51/56* | (2006.01) | |

(52) U.S. Cl.
CPC .......... *H01L 51/5259* (2013.01); *H01L 27/32* (2013.01); *H01L 27/3246* (2013.01); *H01L 27/3283* (2013.01); *H01L 51/0018* (2013.01); *H01L 51/5203* (2013.01); *H01L 51/56* (2013.01)

(58) Field of Classification Search
CPC ......... H01L 29/08; H01L 35/24; H01L 51/00; H01L 51/5259; H01L 51/0018; H01L 27/3246; H01L 51/5203; H01L 27/32; H01L 51/56; H01L 27/3283
See application file for complete search history.

(56) References Cited

U.S. PATENT DOCUMENTS

| | | |
|---|---|---|
| 6,218,206 B1 | 4/2001 | Inoue et al. |
| 8,389,323 B2 | 3/2013 | Choi et al. |
| 2003/0122985 A1 | 7/2003 | Park et al. |
| 2005/0058770 A1 | 3/2005 | Kiguchi et al. |

(Continued)

FOREIGN PATENT DOCUMENTS

| | | |
|---|---|---|
| EP | 2221899 A1 | 8/2010 |
| EP | 2254394 A1 | 11/2010 |

(Continued)

*Primary Examiner* — Ismail A Muse
(74) *Attorney, Agent, or Firm* — Innovation Counsel LLP

(57) ABSTRACT

A method of manufacturing an organic light-emitting display device is provided. The method includes forming a pixel electrode, forming a hydrophobic material layer on the pixel electrode, wherein the hydrophobic material layer includes a hydrophobic material, forming a pixel-defining layer by patterning the hydrophobic material layer, so as to expose at least a portion of the pixel electrode, and removing the hydrophobic material on the exposed portion of the pixel electrode using surface treatment.

5 Claims, 4 Drawing Sheets

(56) References Cited

U.S. PATENT DOCUMENTS

| | | |
|---|---|---|
| 2005/0112341 A1 | 5/2005 | Ito et al. |
| 2006/0022587 A1 | 2/2006 | Jeong et al. |
| 2006/0220542 A1 | 10/2006 | Suh et al. |
| 2006/0273314 A1* | 12/2006 | Lee ............... H01L 27/3246 257/59 |
| 2007/0077349 A1 | 4/2007 | Newman et al. |
| 2007/0190673 A1 | 8/2007 | Ko et al. |
| 2008/0303424 A1 | 12/2008 | Mitsuya et al. |
| 2009/0115318 A1 | 5/2009 | Gregory et al. |
| 2010/0102715 A1 | 4/2010 | Suh |
| 2010/0181559 A1* | 7/2010 | Nakatani ......... H01L 27/3246 257/40 |
| 2010/0202729 A1 | 8/2010 | Kodama et al. |
| 2010/0252857 A1* | 10/2010 | Nakatani ......... H01L 27/3246 257/100 |
| 2010/0289728 A1 | 11/2010 | Nakatani et al. |
| 2010/0308317 A1* | 12/2010 | Ahn ................. B82Y 10/00 257/40 |
| 2011/0198598 A1* | 8/2011 | Kim ................. H01L 27/3246 257/59 |
| 2011/0215330 A1* | 9/2011 | Shin ................. H01L 51/5218 257/59 |
| 2012/0228602 A1* | 9/2012 | Nakatani ......... H01L 51/5088 257/40 |
| 2012/0319089 A1* | 12/2012 | Shin ................. H01L 51/0014 257/40 |
| 2012/0326956 A1 | 12/2012 | Ueki et al. |
| 2013/0140692 A1 | 6/2013 | Kaneko et al. |

FOREIGN PATENT DOCUMENTS

| | | |
|---|---|---|
| KR | 10-0718152 B1 | 5/2007 |
| KR | 10-2009-0077697 A | 7/2009 |
| KR | 10-2010-0045305 A | 5/2010 |
| KR | 10-2011-0059255 A | 6/2011 |
| WO | 2009/075075 A1 | 6/2009 |
| WO | 2009/113239 A1 | 9/2009 |

* cited by examiner

ORGANIC LIGHT-EMITTING DISPLAY DEVICE AND METHOD OF MANUFACTURING THE SAME

CROSS-REFERENCE TO RELATED PATENT APPLICATION

This application is a divisional application of U.S. patent application Ser. No. 14/049,893, filed Oct. 9, 2013, which claims the benefit of Korean Patent Application No. 10-2013-0073972 filed on Jun. 26, 2013, the entire contents of which are herein incorporated by reference.

BACKGROUND

1. Technical Field

The present disclosure generally relates to an organic light-emitting display device and a method of manufacturing the same, and more particularly, to an organic light-emitting display device having low interfacial resistance between a pixel electrode and an intermediate layer.

2. Description of the Related Art

Among display devices, organic light-emitting display devices have been identified as next generation display devices, due to their superior characteristics such as wide viewing angles, excellent contrast, and short response times.

Generally, an organic light-emitting display device includes a structure having a pixel-defining layer covering edges of a pixel electrode and exposing a central portion of the pixel electrode. After the pixel-defining layer has been formed, an intermediate layer including an emission layer is formed on the pixel electrode using methods such as inkjet printing or nozzle printing.

When forming the intermediate layer using existing methods, an ink residue may be formed on the surfaces of the pixel-defining layer and the pixel electrode. The ink residue may weaken the adhesion between layers subsequently deposited on the pixel-defining layer and pixel electrode. To prevent the ink residue from forming on the surface of the pixel-defining layer, the pixel-defining layer may include a material having a hydrophobic property, which gives the pixel-defining layer a liquid-repellent characteristic. However, the hydrophobic material may also render the surface of the pixel electrode hydrophobic, which may cause the interfacial resistance between the pixel electrode and the intermediate layer to increase. Accordingly, the increased resistance may lead to deterioration in the efficiency of the organic light-emitting display device.

SUMMARY

The present disclosure is directed to address at least the above problems relating to the interfacial resistance and efficiency of organic light-emitting display devices.

According to some embodiments of the inventive concept, a method of manufacturing an organic light-emitting display device is provided. The method includes forming a pixel electrode; forming a hydrophobic material layer on the pixel electrode, wherein the hydrophobic material layer includes a hydrophobic material; forming a pixel-defining layer by patterning the hydrophobic material layer, so as to expose at least a portion of the pixel electrode; and removing the hydrophobic material on the exposed portion of the pixel electrode using surface treatment.

In some embodiments, the method may further include forming a photoresist layer on the hydrophobic material layer after the hydrophobic material layer has been formed on the pixel electrode, and forming the pixel-defining layer by patterning the photoresist layer and the hydrophobic material layer in a single process step, so as to expose at least the portion of the pixel electrode, wherein a portion of the photoresist layer remains on an upper surface of the pixel-defining layer after the patterning.

In some embodiments, the method may further include removing the portion of the photoresist layer on the upper surface of the pixel-defining layer after the surface treatment.

In some embodiments, the method may further include forming a photoresist layer on an upper surface of the pixel-defining layer prior to the surface treatment.

In some embodiments, the method may further include removing the photoresist layer on the upper surface of the pixel-defining layer after the surface treatment.

In some embodiments of the method, the surface treatment may include a plasma cleaning method.

In some embodiments of the method, the surface treatment may include an ultra-violet (UV) irradiation method.

According to some other embodiments of the inventive concept, a method of manufacturing an organic light-emitting display device is provided. The method includes forming a pixel electrode; forming a photoresist layer on the pixel electrode; forming a hydrophobic material layer over the pixel electrode and the photoresist layer, wherein the hydrophobic material layer includes a hydrophobic material; and patterning the hydrophobic material layer and the photoresist layer, so as to expose at least a portion of the pixel electrode.

In some embodiments, patterning the hydrophobic material layer and the photoresist layer may include forming a pixel-defining layer by patterning an opening in the hydrophobic material layer, and removing a portion of the photoresist layer, so as to expose at least the portion of the pixel electrode.

In some embodiments, patterning the hydrophobic material layer and the photoresist layer may include patterning the hydrophobic material layer and the photoresist layer in a single process step, so as to expose at least the portion of the pixel electrode.

According to some embodiments of the inventive concept, an organic light-emitting display device is provided. The organic light-emitting display device includes a pixel electrode, and a pixel-defining layer having an opening through which at least a portion of the pixel electrode is exposed, wherein the pixel-defining layer includes a hydrophobic material.

In some embodiments, an upper surface of the pixel-defining layer and a sloped surface in the opening of the pixel-defining layer may have different degrees of hydrophobicity.

In some embodiments, the upper surface of the pixel-defining layer may have a higher degree of hydrophobicity than the sloped surface of the pixel-defining layer.

In some embodiments, the organic light-emitting display device may further include a photoresist layer disposed on portions of the pixel electrode in the opening of the pixel-defining layer.

In some embodiments, the sloped surface in the opening of the pixel-defining layer and a sloped surface of the photoresist layer may be aligned on a common plane.

In some embodiments, the sloped surface in the opening of the pixel-defining layer and a sloped surface of the photoresist layer may have different degrees of hydrophobicity.

In some embodiments, at least an upper surface of the pixel-defining layer may be hydrophobic, and the exposed portion of the pixel electrode may be non-hydrophobic.

In some embodiments, the upper surface and the sloped surface of the pixel-defining layer may be hydrophobic, and the exposed portion of the pixel electrode and a sloped surface of the photoresist layer may be non-hydrophobic.

DETAILED DESCRIPTION

Figure 1:
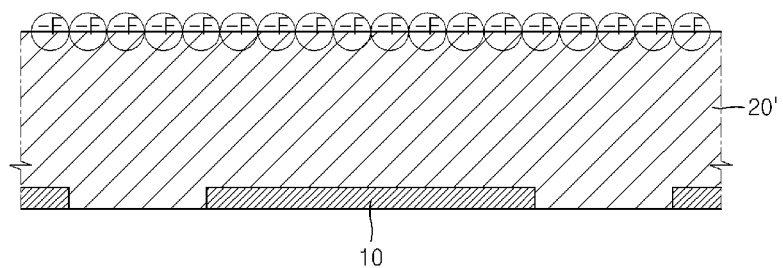
FIGS. 1 through 6 illustrate cross sectional views of an exemplary organic light-emitting display device at different stages of fabrication according to some methods of manufacturing the organic light-emitting display device.

The present inventive concept will be described more fully herein with reference to the accompanying drawings, in which exemplary embodiments are shown. The inventive concept may be embodied in different forms and should not be construed as being limited to the disclosed embodiments. The embodiments are intended to disclose and convey the scope of the inventive concept to those skilled in the art. In the drawings, the lengths and sizes of layers and regions may have been exaggerated for clarity.

It will be understood that when an element or layer is referred to as being disposed "on" another element or layer, the element or layer can be disposed directly on the other element or layer, or disposed on the other element or layer with one or more intervening elements or layers being present.

FIGS. 1 through 5 illustrate cross sectional views of an exemplary organic light-emitting display device at different stages of fabrication according to a first method of manufacturing the organic light-emitting display device.

Referring to FIG. 1, a pixel electrode 10 is formed on a substrate (not shown). A hydrophobic material layer 20' including a hydrophobic material is formed covering the pixel electrode 10. As shown in FIGS. 1 though 5, the hydrophobic material may include fluorine (F).

The pixel electrode 10 may include a transparent electrode or a reflective electrode. The transparent electrode may include a layer formed of indium tin oxide (ITO), indium zinc oxide (IZO), zinc oxide (ZnO), or $In_2O_3$. The reflective electrode may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a blend thereof. The reflective electrode may also include a layer formed of ITO, IZO, ZnO, or $In_2O_3$.

Referring to FIG. 1, the hydrophobic material layer 20' may correspond to a state prior to patterning (i.e. before the hydrophobic material layer 20' is patterned to form a pixel-defining layer 20). In some embodiments, the hydrophobic material layer 20' may include a layer consisting of a hydrophobic material. In some other embodiments, the hydrophobic material layer 20' may include a layer comprising a hydrophobic material in an organic insulating layer. The organic insulating layer may include an acryl-based polymer (such as polymethylmethacrylate (PMMA)), polystyrene (PS), a polymer derivative having a phenol group, imide-based polymer, aryl ether-based polymer, amide-based polymer, fluorine-based polymer, p-xylene-based polymer, vinyl alcohol-based polymer, or a blend thereof.

Figure 2:
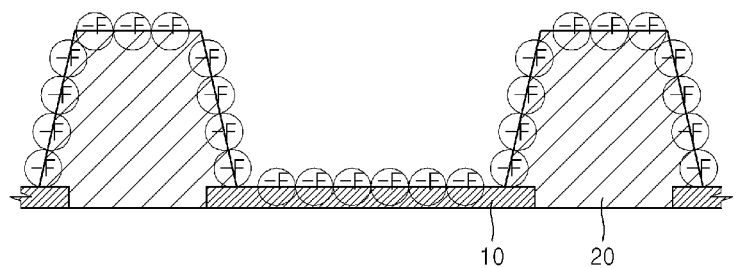

Referring to FIG. 2, the pixel-defining layer 20 is formed by etching an opening in the hydrophobic material layer 20'. The pixel-defining layer 20 is formed such that at least a portion of the pixel electrode 10 (including a central portion of the pixel electrode 10) is exposed after the patterning of the hydrophobic material layer 20'.

As shown in FIG. 1, fluorine (F) groups (providing hydrophobicity) are present on a top surface of the hydrophobic material layer 20'. After the hydrophobic material layer 20' has been patterned to form the pixel-defining layer 20, fluorine (F) groups are also present on the exposed surface of the pixel electrode 10, in addition to being present on the exposed surface of the pixel-defining layer 20, as illustrated in FIG. 2.

Figure 3:
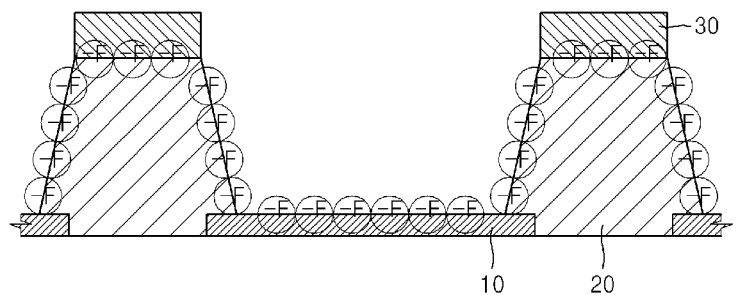

Next, as shown in FIG. 3, a photoresist (PR) layer 30 is formed on a portion of the pixel-defining layer 20. The photoresist layer 30 may be formed on an upper surface of the pixel-defining layer 20, so as to preserve the hydrophobicity of the upper surface of the pixel-defining layer 20 during the subsequent surface treatment described below with reference to FIG. 4.

Figure 4:
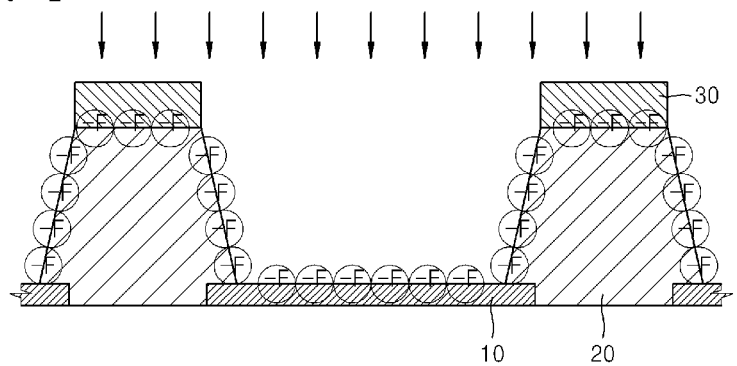

As shown in FIG. 4, the structure in FIG. 3 undergoes surface treatment (denoted by the downward pointing arrows), so as to remove the fluorine (F) groups on the exposed surface of the pixel electrode 10. The surface treatment may include plasma cleaning methods, ultraviolet (UV) irradiation, or other known surface treatment methods. Referring to FIG. 4, the upper surface of the pixel-defining layer 20 is protected by the photoresist layer 30. As a result, the upper surface of the pixel-defining layer 20 is unaffected by the surface treatment.

Figure 5:
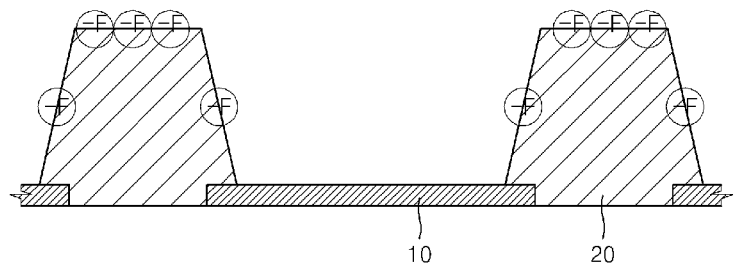

After the surface treatment, the photoresist layer 30 is removed, so as to expose the upper surface of the pixel-defining layer 20. As shown in FIG. 5, the upper surface of the pixel-defining layer 20 (that was previously protected by the photoresist layer 30) maintains its original hydrophobicity, with the fluorine (F) groups remaining intact on the upper surface of the pixel-defining layer 20. Conversely, there are no fluorine (F) groups remaining on the exposed surface of the pixel electrode 10 after the surface treatment.

As shown in FIGS. 4 and 5, the sloped surface in the opening of the pixel-defining layer 20 is exposed and therefore subject to the surface treatment. However, since the sloped surface is exposed at an angle (e.g. oblique to the direction of the plasma field), the surface treatment may be less effective on the sloped surface compared to a horizontal exposed surface. As a result, some fluorine (F) groups may remain on the sloped surface of the pixel-defining layer 20 after the surface treatment. The sloped surface of the pixel-defining layer 20 may have weaker hydrophobicity compared to the upper surface of the pixel-defining layer 20 (that was previously protected by the photoresist layer 30). Accordingly, the upper surface and the sloped surface of the pixel-defining layer 20 may have varying degrees of hydrophobicity, as illustrated in FIG. 5. Nevertheless, it is noted that in some cases, the sloped surface of the pixel-defining layer 20 may completely lose their hydrophobicity after the surface treatment. For example, the loss in hydrophobicity may be a function of the angle of the sloped surface and the type (and conditions) of surface treatment used.

According to the inventive concept, the hydrophobic nature of the upper surface of the pixel-defining layer 20 prevents an ink residue from forming on the upper surface of the pixel-defining layer 20 during subsequent formation of an intermediate layer (not shown). The intermediate layer may be formed, for example, using an inkjet printing method. As noted previously, the interfacial resistance between the pixel electrode 10 and the intermediate layer may increase if the surface of the pixel electrode 10 is hydrophobic. However, in the above-described embodiment, the hydrophobicity of the pixel electrode 10 is removed by the surface treatment. Accordingly, a low interfacial resistance between the pixel electrode 10 and the intermediate layer may be achieved using the structure of FIG. 5 and the first exemplary method described above. Accordingly, the efficiency of the organic light-emitting display device can be maintained.

Next, a second exemplary method of manufacturing the organic light-emitting display device of FIG. 5 will be described. Comparing the second exemplary method to the first exemplary method, it is noted that the intermediary structure illustrated in FIG. 2 may be omitted when the second exemplary method is used, because the second exemplary method involves simultaneously patterning the hydrophobic material layer 20' and photoresist layer 30 in the structure of FIG. 6, as described below.

Figure 6:
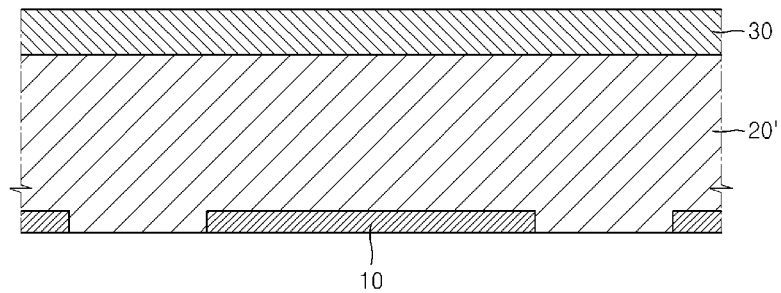

Referring to FIG. 6, a photoresist layer 30 is formed on a surface of the structure in FIG. 1. Specifically, the photoresist layer 30 is formed on the surface of the hydrophobic material layer 20'.

Next, the hydrophobic material layer 20' and the photoresist layer 30 are simultaneously patterned to obtain the structure illustrated in FIG. 3. As mentioned previously, at least a portion of the pixel electrode 10 (including a central portion of the pixel electrode 10) is exposed after the patterning of the hydrophobic material layer 20'. Also, fluorine (F) groups (providing hydrophobicity) are present on the exposed surface of the pixel electrode 10 and the surface of the pixel-defining layer 20. As shown in FIG. 3, the (patterned) photoresist layer 30 may be formed covering an upper surface of the pixel-defining layer 20, so as to preserve the hydrophobicity of the upper surface of the pixel-defining layer 20 during the subsequent surface treatment of the pixel electrode 10.

Next, as previously described with reference to FIG. 4, the fluorine (F) groups on the exposed surface of the pixel electrode 10 are removed by the surface treatment which includes plasma cleaning methods, ultraviolet (UV) irradiation, or other known surface treatment methods.

After the surface treatment, the (patterned) photoresist layer 30 is removed, so as to expose the upper surface of the pixel-defining layer 20. As shown in FIG. 5, the upper surface of the pixel-defining layer 20 (that was previously protected by the photoresist layer 30) maintains its original hydrophobicity, with the fluorine (F) groups remaining intact on the upper surface of the pixel-defining layer 20. Conversely, there are no fluorine (F) groups remaining on the exposed surface of the pixel electrode 10 after the surface treatment.

As mentioned previously, the hydrophobic nature of the upper surface of the pixel-defining layer 20 prevents an ink residue from forming on the upper surface of the pixel-defining layer 20 during subsequent formation of an intermediate layer. If the surface of the pixel electrode 10 is hydrophobic, the interfacial resistance between the pixel electrode 10 and the intermediate layer may increase. However, in the embodiment of FIG. 5, the hydrophobicity of the pixel electrode 10 is removed by the surface treatment. Accordingly, a low interfacial resistance between the pixel electrode 10 and the intermediate layer may be achieved using the structure of FIG. 5 and the second exemplary method described above. Accordingly, the efficiency of the organic light-emitting display device can be maintained.

Figure 7:
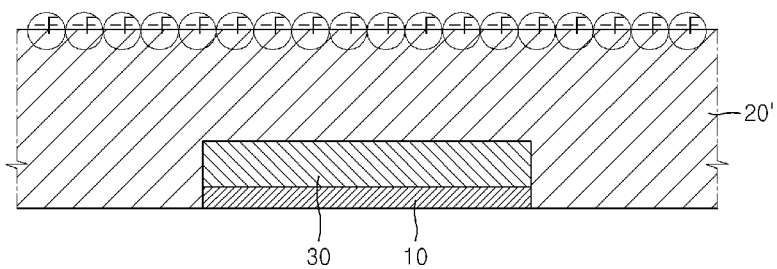
FIGS. 7 through 9 illustrate cross sectional views of another exemplary organic light-emitting display device at different stages of fabrication according to a method of manufacturing the organic light-emitting display device.
Figure 8:
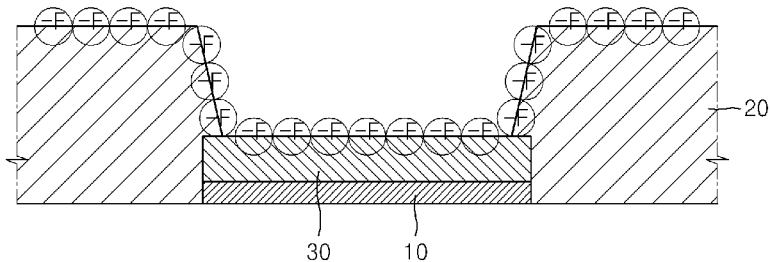
Figure 9:
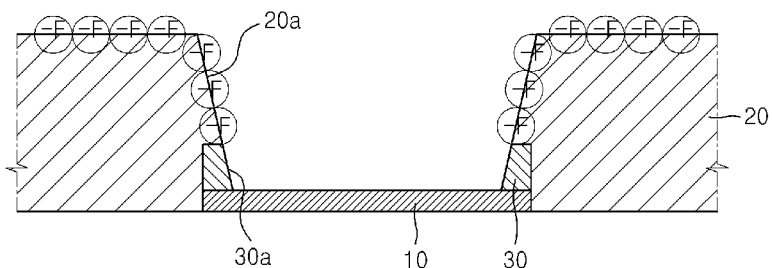

FIGS. 7 through 9 illustrate cross sectional views of another exemplary organic light-emitting display device at different stages of fabrication according to a method of manufacturing the organic light-emitting display device. The exemplary organic light-emitting display device depicted in FIGS. 7-9 includes elements similar to those in FIGS. 1-6. Like reference numerals are assigned to like constituent elements of the aforementioned embodiments and thus, detailed description of those elements shall be omitted.

Referring to FIG. 7, a pixel electrode 10 is formed on a substrate (not shown) and a photoresist layer 30 is then formed on the pixel electrode 10. Next, a hydrophobic material layer 20' including a hydrophobic material is formed covering the pixel electrode 10 and the photoresist layer 30. As shown in FIGS. 7-9, the hydrophobic material may include fluorine (F).

Next, the hydrophobic material layer 20' is patterned so as to expose at least a central portion of the pixel electrode 10. In some embodiments, the central portion of the pixel electrode 10 may be exposed by patterning the hydrophobic material layer 20' to form a pixel-defining layer 20 in a first process step (FIG. 8), followed by the patterning of the photoresist layer 30 in a second process step (FIG. 9). As shown in FIG. 8, the photoresist layer 30 is disposed in an opening of the pixel-defining layer 20 after the first process step. In some other embodiments, the first and second process steps may be combined into a single process step (i.e. the hydrophobic material layer 20' and the photoresist layer 30 in FIG. 7 may be simultaneously patterned/etched to form the structure in FIG. 9).

As shown in FIG. 9, after the central portion of the pixel electrode 10 has been exposed, fluorine (F) groups are present on the upper surface of the pixel-defining layer 20 and the sloped surface 20a in the opening of the pixel-defining layer 20. Accordingly, the upper surface and sloped surface 20a of the pixel-defining layer 20 are hydrophobic. Conversely, fluorine (F) groups are absent from the exposed surface of the pixel electrode 10 and the sloped surface 30a in the opening of the photoresist layer 30. Accordingly, the exposed surface of the pixel electrode 10 and the sloped surface 30a of the photoresist layer 30 are non-hydrophobic. It is noted that the sloped surfaces 20a and 30a may be aligned on a common plane, and that the sloped surfaces 20a and 30a may have varying degrees of hydrophobicity depending on the number of fluorine (F) groups present on each sloped surface. Additionally, in some embodiments, the upper surface and sloped surface 20a of the pixel-defining layer 20 may have different degrees of hydrophobicity. For example, the upper surface of the pixel-defining layer 20 may be more hydrophobic than the sloped surface 20a.

According to the inventive concept, the hydrophobic nature of the surface of the pixel-defining layer 20 prevents an ink residue from forming on the surface of the pixel-defining layer 20 during subsequent formation of an intermediate layer (not shown). The intermediate layer may be formed, for example, using an inkjet printing method. As noted previously, the interfacial resistance between the pixel electrode 10 and the intermediate layer may increase if the surface of the pixel electrode 10 is hydrophobic. However, in the embodiment of FIG. 9, the exposed surface of the pixel electrode 10 is non-hydrophobic. Accordingly, a low interfacial resistance between the pixel electrode 10 and the intermediate layer may be achieved using the structure of FIG. 9 and the above-described method. Accordingly, the efficiency of the organic light-emitting display device can be maintained.

Figure 10:
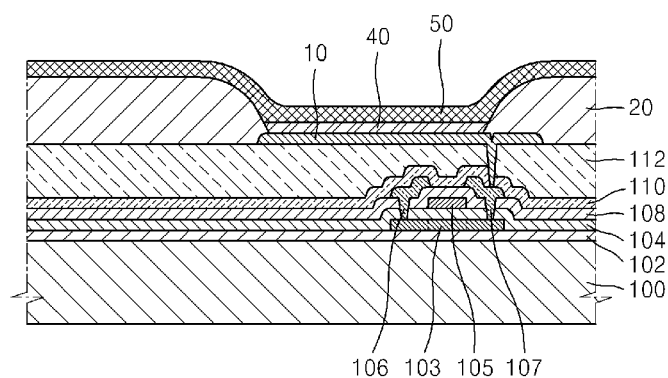
FIG. 10 illustrates a cross sectional view of an organic light-emitting display device according to another embodiment of the inventive concept.

FIG. 10 illustrates a cross sectional view of an organic light-emitting display device according to another embodiment of the inventive concept. The organic light-emitting display device of FIG. 10 includes elements similar to those in FIGS. 1-9. Like reference numerals are assigned to like constituent elements of the aforementioned embodiments and thus, detailed description of those elements shall be omitted.

Referring to FIG. 10, the organic light-emitting display device includes various elements disposed on a substrate 100. The substrate 100 may include a transparent material, such as glass, plastic, or a transparent metallic material. The various elements in the organic light-emitting display device are described as follows.

As shown in FIG. 10, a buffer layer 102 is disposed on the substrate 100. A semiconductor layer 103 is disposed on a portion of the buffer layer 102. A gate insulating layer 104 is disposed on the buffer layer 102 and the semiconductor layer 103. A gate electrode 105 is disposed on the gate insulating layer 104 directly above the semiconductor layer 103. An interlayer insulating layer 108 is disposed on the gate insulating layer 104 and the gate electrode 105. A source electrode 106 and a drain electrode 107 are formed by etching vias in the gate insulating layer 104 and interlayer insulating layer 108 to expose portions of the semiconductor layer 103, and filling the vias with conductive material. The semiconductor layer 103, gate electrode 105, source electrode 106, and drain electrode 107 collectively constitute a thin film transistor (TFT). A protection layer 110 is disposed on the interlayer insulating layer 108 and source/drain electrodes 106/107. A planarization layer 112 is disposed on the protection layer 110 to provide a top planar surface.

An organic light-emitting device (OLED) is disposed on the planarization layer 112. The OLED includes a pixel electrode 10, a pixel-defining layer 20, an intermediate layer 40, and a counter electrode 50.

The pixel electrode 10 is electrically connected to the TFT through a via etched in the planarization layer 112 and protection layer 110. As shown in FIG. 10, the pixel electrode 10 is disposed on a portion of the planarization layer 112 and formed by filling the via with a conductive material, such that the pixel electrode 10 makes contact with the drain electrode 107. The pixel-defining layer 20 is disposed on the planarization layer 112 and pixel electrode 10, and includes an opening defining a pixel region of the pixel electrode 10. The size of the opening in the pixel-defining layer 20 may be less than the size of the pixel electrode 10, such that edge portions of the pixel electrode 10 may be covered by the pixel-defining layer 20 (see FIG. 10). The intermediate layer 40 is disposed on the pixel electrode 10 within the opening of the pixel-defining layer 20. The intermediate layer 40 may include an emission layer, and may be formed, for example, using an inkjet printing method. Lastly, the counter electrode 50 is disposed on the pixel-defining layer 20 and intermediate layer 40, over an area substantially covering the entire surface of the substrate 100.

In some embodiments, the intermediate layer 40 may include multiple layers. In some other embodiments, the intermediate layer 40 may consist of a single layer. In some further embodiments, the intermediate layer 40 may be formed having a width corresponding to that of the pixel electrode 10.

The organic light-emitting display device may include the embodiments illustrated in FIGS. 5 and 9. For example, with reference to FIG. 10, the surface of the pixel electrode 10 (that is in contact with the intermediate layer 40) may be rendered non-hydrophobic, and the surface of the pixel-defining layer 20 may be rendered hydrophobic, using the methods described in FIGS. 1 through 9. As mentioned previously, the hydrophobic nature of the surface of the pixel-defining layer 20 prevents an ink residue from forming on the surface of the pixel-defining layer 20 during formation of the intermediate layer 40. If the surface of the pixel electrode 10 is hydrophobic, the interfacial resistance between the pixel electrode 10 and the intermediate layer may increase. However, in the embodiment of FIG. 10, the hydrophobicity of the pixel electrode 10 may be removed by the surface treatment methods previously described. Accordingly, a low interfacial resistance between the pixel electrode 10 and the intermediate layer 40 may be achieved using the structure of FIG. 10. Accordingly, the efficiency of the organic light-emitting display device can be maintained.

While the inventive concept has been described with reference to exemplary embodiments, it will be understood by those of ordinary skill in the art that various modifications may be made to the described embodiments, without departing from the spirit and scope of the disclosure.

What is claimed is:

1. An organic light-emitting display device comprising:
   a pixel electrode including an end portion having an upper end surface and a side end surface; and
   a pixel-defining layer overlapping the end portion of the pixel electrode and directly contacting the side end surface of the pixel electrode, and having an opening through which at least a portion of the pixel electrode is exposed,
   wherein the pixel-defining layer includes a hydrophobic material,
   wherein an upper surface of the pixel-defining layer and a sloped surface in the opening of the pixel-defining layer have different degrees of hydrophobicity, and
   wherein the sloped surface of the pixel-defining layer in the opening has less degree of hydrophobicity than the upper surface of the pixel-defining layer, and
   wherein the sloped surface of the pixel-defining layer has a slope of the same angle in all sloped surface, and the sloped surface of the pixel-defining layer has less degree of hydrophobicity than the upper surface of the pixel-defining layer depending on the angle of the sloped surface.

2. The display device of claim 1, wherein the upper surface of the pixel-defining layer has a higher degree of hydrophobicity than the sloped surface of the pixel-defining layer.

3. The display device of claim 1, wherein at least an upper surface of the pixel-defining layer is hydrophobic, and the exposed portion of the pixel electrode is non-hydrophobic.

4. An organic light-emitting display device comprising:
   a pixel electrode including an end portion having an upper end surface and a side end surface;
   a pixel-defining layer overlapping the end portion of the pixel electrode and directly contacting the side end surface of the pixel electrode, and having an opening through which at least a portion of the pixel electrode is exposed; and
   a photoresist layer disposed on portions of the pixel electrode in the opening of the pixel-defining layer,
   wherein the pixel-defining layer includes a hydrophobic material, wherein the sloped surface in the opening of the pixel-defining layer and a sloped surface in the opening of the photoresist layer are aligned on a common plane, wherein the sloped surface in the opening of the pixel-defining layer and a sloped surface of the photoresist layer have different degrees of hydrophobicity.

5. The display device of claim 4, wherein the upper surface and the sloped surface of the pixel-defining layer are hydrophobic, and the exposed portion of the pixel electrode and a sloped surface of the photoresist layer are non-hydrophobic.

* * * * *